United States Patent [19]

Lien et al.

[11] Patent Number: 5,284,800
[45] Date of Patent: Feb. 8, 1994

[54] METHOD FOR PREVENTING THE EXPOSURE OF BOROPHOSPHOSILICATE GLASS TO THE AMBIENT AND STOPPING PHOSPHORUS IONS FROM INFILTRATING SILICON IN A SEMICONDUCTOR PROCESS

[75] Inventors: Chuen-Der Lien, Mountain View; Daniel Liao, Pleasanton; Jowei Dun, San Jose, all of Calif.

[73] Assignee: Integrated Device Technology, Inc., Santa Clara, Calif.

[21] Appl. No.: 838,538

[22] Filed: Feb. 19, 1992

[51] Int. Cl.$^5$ .............................................. H01L 21/44
[52] U.S. Cl. .................................... 437/195; 437/240; 437/982; 437/236; 148/DIG. 133
[58] Field of Search ............... 437/240, 982, 236, 195; 148/DIG. 133

[56] References Cited

U.S. PATENT DOCUMENTS 4,948,743  8/1990  Ozaki .................................. 437/982
5,094,984  3/1992  Liu et al. ....................... 148/DIG. 133

FOREIGN PATENT DOCUMENTS 0118356  9/1981  Japan .
0158931  9/1983  Japan ................................. 437/982
0224226  9/1990  Japan ................................. 437/982

OTHER PUBLICATIONS

Wolf; "Silicon Processing for the VLSI Era", vol. 1, 1987; pp. 367–371.

Primary Examiner—Brian E. Hearn
Assistant Examiner—Trung Dang
Attorney, Agent, or Firm—Thomas E. Schatzel

[57] ABSTRACT

An embodiment of the present invention is a semiconductor fabrication process that deposits an oxide layer after a step to make contact openings in a BPSG layer and before a contact reflow step. The oxide allows implant dopants to be properly activated in the contact reflow step without excessive reflow of the BPSG.

5 Claims, 2 Drawing Sheets

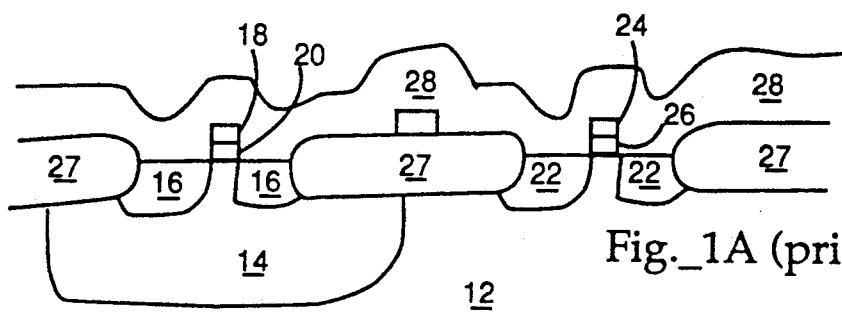
Fig._1A (prior art)
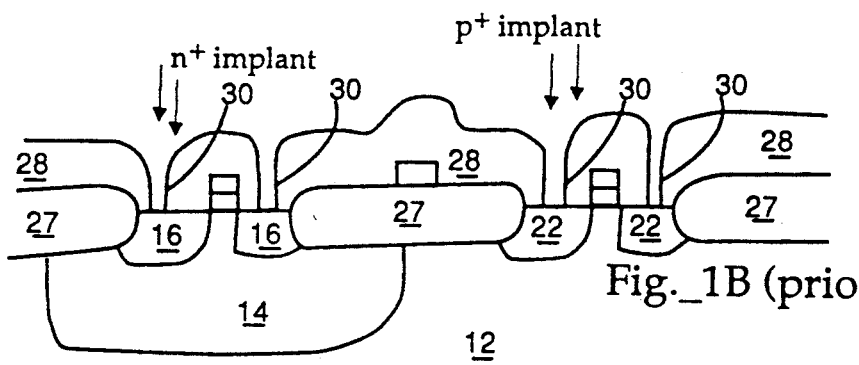
Fig._1B (prior art)
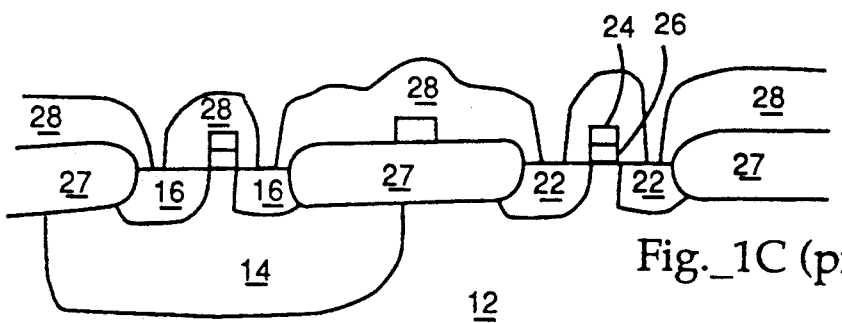
Fig._1C (prior art)
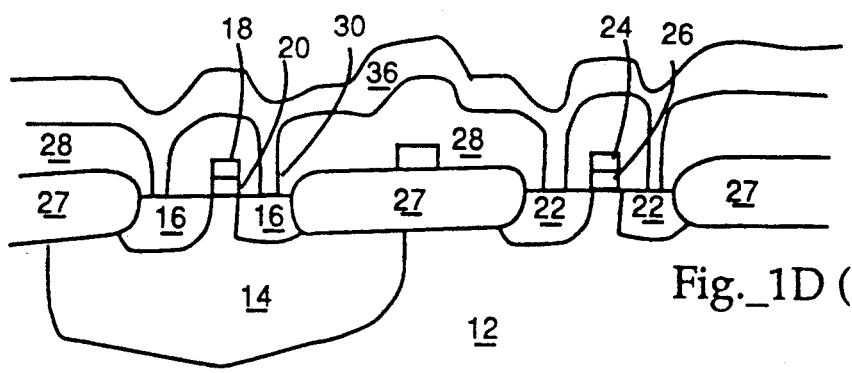
Fig._1D (prior art)

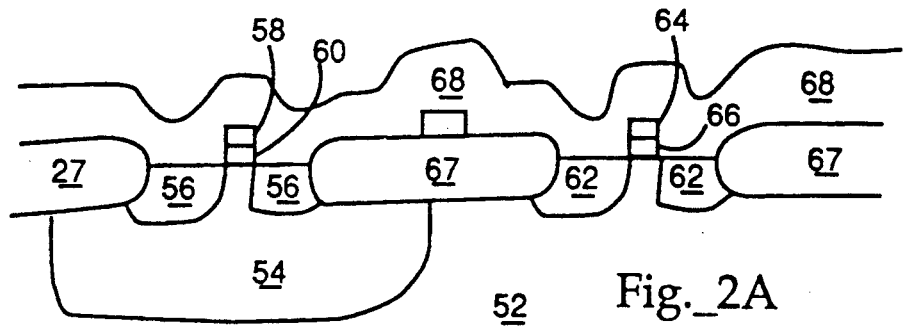
Fig._2A
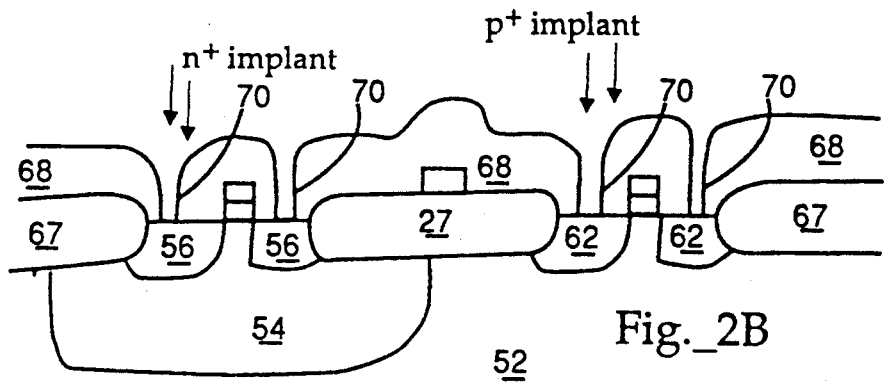
Fig._2B
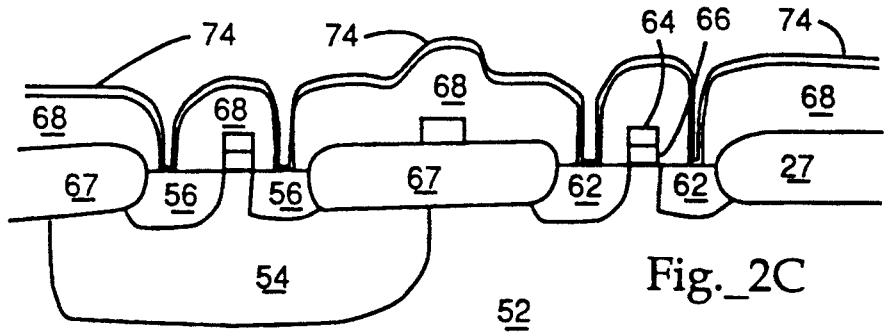
Fig._2C
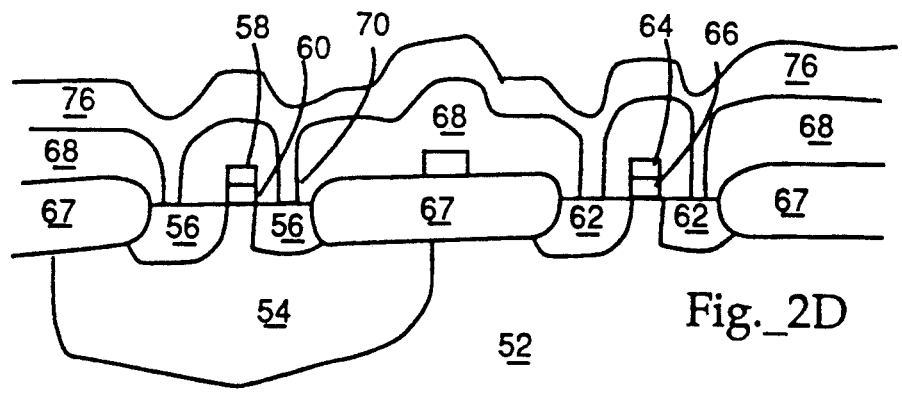
Fig._2D

METHOD FOR PREVENTING THE EXPOSURE OF BOROPHOSPHOSILICATE GLASS TO THE AMBIENT AND STOPPING PHOSPHORUS IONS FROM INFILTRATING SILICON IN A SEMICONDUCTOR PROCESS

BACKGROUND OF THE INVENTION

1. Field of the Invention

The invention relates generally to semiconductor fabrication and more particularly to using BPSG in an integrated circuit process.

2. Description of the Prior Art

A typical semiconductor device fabricating process is shown in the exemplary sequence of FIGS. 1A through 1D. In FIG. 1A, an n-substrate 12 is processed to the point where a p-well 14 has been diffused with two n+ regions 16 flanking a polysilicon gate 18 over a gate oxide 20 to make a n-channel transistor. Two p+ regions 22 flanking a polysilicon gate 24 over a gate oxide 26 are diffused in the n-substrate 12 to form an p-channel transistor. Field oxide 27 separates the various structures. A deposition of borophosphosilicate glass (BPSG) 28 then follows. PSG could also have been used. The BPSG layer 28 is shown, in FIG. 1B, after an annealing step and contact opening, e.g. openings 30. An ion implant is made for n+ contacts through the respective contact holes 30 for the n-channel transistor. An ion implant for p+ contacts is then made through the respective contact holes 30 for the p-channel transistor. FIG. 1C shows how contact reflow softens the slopes of the contact. Such softening and too much reflow can cause problems, but the contact reflow step must be hot enough and long enough to activate the dopant implanted in regions 16 and 22. In FIG. 1D, a first connecting metal ("metal-1") 36 is deposited.

The composition and thickness of the borophosphosilicate glass (BPSG) layers are chosen such that the BPSG material will liquify a bit and flow out over the wafer topography to form a smooth layer during the above BPSG annealing step. The resulting BPSG layer has to be thick enough to keep the metal layer capacitance with the lower layers low.

The contact opening step typically comprises an isotropic etch is typically followed by an anisotropic etch. When the design rules are very tight, the isotropic contact etch step has to be minimized to avoid exposing underlying structures that can then be shorted to the metal when it is deposited in the contact hole. For example, the gate electrode polysilicon can be exposed.

Such constraints often cause one or more problems to manifest themselves during the contact reflow step. These include:

crystals of BPSG that occasionally form around the contacts due to an interaction of BPSG and the ambient;

increases in p-type contact resistance due to phosphorus outgasing from BPSG and getting into silicon and boron segregate out of silicon into oxide therefore need high dose of p+ contact implant;

metal step coverage problems stemming from the BPSG material flowing so much that it causes a re-entrant contact profile in the topography and a nonuniform BPSG composition;

oxide in the n+ contact being much thicker than that in the p+ contact, therefore need to dip off a lot of BPSG before metal deposition; and the silicide occasionally lifting off when the silicide is exposed by contacts.

SUMMARY OF THE PRESENT INVENTION

It is therefore an object of the present invention to provide a simple process method to prevent crystals of borophosphosilicate glass (BPSG) from forming around the contacts, limit p-type contact resistance increases, cure metal step coverage problems, even out the oxide between the n+ and p+ contacts, and prevent silicide layers from lifting off.

Briefly, an embodiment of the present invention is a semiconductor fabrication process that deposits an oxide layer after a step to make contact openings in a BPSG layer and before a contact reflow step.

An advantage of the present invention is that by depositing a thin oxide before contact reflow, no borophosphosilicate glass (BPSG) crystals form because the BPSG is not exposed to the ambient.

Another advantage of the present invention is that a low P-type contact resistance results because the thin oxide stops phosphorous ions in the borophosphosilicate glass (BPSG) from getting into the silicon and it minimizes silicon oxidation. Therefore the boron will not segregate out of silicon.

Another advantage of the present invention is that a minimum of borophosphosilicate glass (BPSG) flows at contact reflow, therefore making a better contact profile, which in turn means better metal step coverage.

Another advantage of the present invention is that oxide in the n+ and p+ contacts have similar thicknesses and at a pre-metal dip stage the borophosphosilicate glass (BPSG) will be etched off only after the thin oxide is gone. BPSG loss is thereby minimized.

Another advantage of the present invention is that p+ contact implant doses can be reduced due to low p-type contact resistance.

Another advantage of the present invention is that the silicide layer is covered by an oxide layer, thereby reducing the chances of the silicide lifting off.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

FIGS. 1A-1D are a sequence of cross-sectional views of a prior art semiconductor device being fabricated with a prior art process; and FIGS. 2A-2D are a sequence of cross-sectional views of a semiconductor device during various stages of a process embodiment of the present invention.

DETAILED DESCRIPTION OF THE PREFERRED EMBODIMENTS

A semiconductor device fabricating process according to the present invention is shown in the sequence of FIGS. 2A through 2D. In FIG. 2A, an n-substrate 52 is processed to the point where a p-well 54 has been diffused with two n+ regions 56 flanking a polysilicon gate 58 over a gate oxide 60 making an n-channel transistor, and two p+ regions 62 flanking a polysilicon gate 64 over a gate oxide 66 are diffused in the n-substrate 52 making a p-channel transistor. A deposition of borophosphosilicate glass (BPSG) 68 then follows. Glasses such PDO and PSG can also be used instead of BPSG layer 68. In FIG. 2B, the BPSG layer 68 is shown after an annealing step and contact opening that opens up a plurality of contact holes 70. Holes 70 are typically one micron. An ion implant for n+ contacts in regions 56 is made through respective contact holes 70 for the n-channel transistor. An ion implant for p+ contacts in regions 62 is then made through respective contact holes 70 for the p-channel transistor. The p+ contact implant doses can be reduced over the conventional levels due to low p-type contact resistance that results from this process. FIG. 2C shows an oxide layer 74 that has been deposited about 100Å thick uniformly over the BPSG layer 68. This thickness is preferred for instances where the reflow temperature will be about 900° C. for about thirty minutes. Uniformity of layer 74 is necessary so that it and not much of BPSG layer 68 will be removed later. Acceptable step coverage of oxide layer 74 in contact holes 70 is 50% on the walls and 60% on the bottom. A Novellus CVD machine, which is commonly available, can be used to achieve the above aims. Thicknesses for layer 74 approaching 200Å will be necessary for higher contact reflow temperatures and/or durations. After contact reflow, oxide 74 is "dipped-off" in a diluted HF solution, or other similar solution having a wetting agent and that will be active within the small opening of contact holes 70.

By depositing a thin oxide before contact reflow, borophosphosilicate glass (BPSG) crystals cannot form because the BPSG is not exposed to the ambient. The thin oxide also will stop phosphorous ions in the borophosphosilicate glass (BPSG) from getting into the silicon. It also minimizes silicon oxidation. This is such that boron will not segregate out of the silicon. During contact reflow, a minimum of BPSG will flow. This makes for a better contact profile, and, in turn, means better metal step coverage. FIG. 2D therefore does not show the contact opening 70 softening, as is apparent in FIG. 1C. The oxide within the n+ and p+ contacts have similar thicknesses, and at a premetal dip stage, the BPSG will be etched off only after the thin oxide is gone. BPSG loss is thereby minimized. A silicide layer comprising part of gate 58 is covered by an oxide layer, thereby reducing the chances of the silicide lifting off. In FIG. 2D, a first connecting metal ("metal 1") 76 is deposited.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A semiconductor fabrication method for preventing the exposure of glass to the ambient, comprising the steps of:

depositing a glass layer after an annealing step and a contact opening step that opens up a plurality of contact holes in a semiconductor substrate;

ion implanting for a plurality of contacts through respective contact holes for at least one transistor disposed in said substrate;

depositing an oxide layer uniformly over said glass layer with a step coverage of approximately 50% on the walls and 60% on the bottom of said contact holes, wherein the depositing of said oxide layer on said glass protects said glass layer from the ambient environment, and wherein said oxide layer acts as a barrier to any phosphorous ions in said glass and prevents said ions from migrating into a silicon material and thus minimizes silicon oxidation; and contact reflowing at an elevated temperature for a first time duration.

2. The method of claim 1, wherein:

the depositing is such that said oxide layer is deposited approximately 100Å thick; and the contact reflowing is such that said elevated temperature is approximately 900° C. and said first time duration is about thirty minutes.

3. The method of claim 1, wherein:

the depositing is such that said oxide layer is deposited nears 200Å thick; and the contact reflowing is such that said elevated temperature is exceeds 900° C. and/or said first time duration exceeds thirty minutes.

4. A semiconductor fabrication method for preventing the exposure of borophosphosilicate glass (BPSG) to the ambient, comprising the steps of:

processing an n-substrate to a point where a p-well has been diffused with n+ regions flanking a polysilicon gate over a gate oxide making an n-channel transistor, and p+ regions flanking a polysilicon gate 64 over a gate oxide are diffused in the n-substrate making a p-channel transistor;

depositing a BPSG glass layer after an annealing step and a contact opening that opens up a plurality of contact holes;

ion implanting for n+ contacts through respective contact holes for said n-channel transistor;

ion implanting for p+ contacts through respective contact holes for said p-channel transistor, wherein said p+ contact implant doses are reduced over conventional levels due to a resulting low p-type contact resistance;

depositing an oxide layer about 100Å to 200Å thick uniformly over said BPSG layer with a step coverage of approximately 50% on the walls and 60% on the bottom of said contact holes; and contact reflowing at about 900° C. for about thirty minutes.

5. The method of claim 4, further comprising the step of:

dipping in a solution equivalent to hydrofluoric (HF) solution with a wetting agent to be active within said contact hole openings.

* * * * *